United States Patent
Nagano et al.

(10) Patent No.: US 7,487,286 B2
(45) Date of Patent: Feb. 3, 2009

(54) FLASH MEMORY AND METHOD FOR CONTROLLING THE MEMORY

(75) Inventors: Osamu Nagano, Tokyo (JP); Isamu Nakajima, Kawasaki (JP)

(73) Assignee: Spansion LLC, Sunnyvale, CA (US)

( * ) Notice: Subject to any disclaimer, the term of this patent is extended or adjusted under 35 U.S.C. 154(b) by 85 days.

(21) Appl. No.: 11/083,016

(22) Filed: Mar. 18, 2005

(65) Prior Publication Data

US 2005/0166005 A1 Jul. 28, 2005

Related U.S. Application Data

(63) Continuation of application No. PCT/JP03/02404, filed on Feb. 28, 2003.

(51) Int. Cl.
*G06F 12/00* (2006.01)
*G06F 13/00* (2006.01)

(52) U.S. Cl. .................. 711/103; 711/100; 711/154; 365/185.33

(58) Field of Classification Search .................. 711/1, 711/103, 100, 154, 185.29, 185.33; 365/185.33, 365/185.29
See application file for complete search history.

(56) References Cited

U.S. PATENT DOCUMENTS

| 6,378,033 | B1 | 4/2002 | Nishikawa |
| 6,604,168 | B2 * | 8/2003 | Ogawa ................ 711/103 |

FOREIGN PATENT DOCUMENTS

| CN | 1249463 A | 4/2000 |
| EP | 0990989 A2 * | 4/2000 |
| JP | 4-157699 A | 5/1992 |
| JP | 6-222985 A | 8/1994 |
| JP | 7-271645 A | 10/1995 |
| JP | 2000-76117 A | 3/2000 |
| JP | 2000-105694 A | 4/2000 |
| JP | 2000-278730 A | 10/2000 |
| TW | 449688 B | 8/2001 |

* cited by examiner

*Primary Examiner*—Tuan V. Thai
(74) *Attorney, Agent, or Firm*—Arent Fox LLP

(57) ABSTRACT

A flash memory is arranged to notice the state inside the flash memory to the outside for supporting a garbage collection. The flash memory includes a state information generator and an output unit. The state information generator generates state information that indicates a state of each user area for noticing it to the outside. The output unit outputs the state information to the outside for noticing the state inside the flash memory to the outside.

10 Claims, 18 Drawing Sheets

FLASH MEMORY AND METHOD FOR CONTROLLING THE MEMORY

This application is a continuing application, filed under 35 U.S.C. §111(a), of International Application PCT/JP2003/002404, filed Feb. 28, 2003.

BACKGROUND OF THE INVENTION (1) Field of the Invention

The present invention relates to a flash memory and a method for controlling the operation of the flash memory. In particular, the present invention relates to a flash memory including a memory cell array composed of a plurality of user areas each of which stores data and a plurality of flag areas each of which indicates a state of each user area and the method for controlling the flash memory.

(2) Description of the Related Art

A flash memory is an electrically erasable (rewritable) nonvolatile memory and is installed in various electric appliances. Today, there have been proposed various new memories that are fast and low in power consumption, such as a FeRAM (Ferroelectric Random Access Memory), a MRAM (Magnetoresistive Random Access Memory), and an OUM (Ovonics Unified Memory). From a viewpoint of cost, however, the flash memory has the better of the other kinds of memories. In particular, for a portable phones with a digital camera or a digital camera itself, the flash memory substantially occupies all of the storage.

On the contrary to the foregoing merit, the flash memory involves the following demerit. Since the flash memory can not overwrite data on the previously written data, the repetition of writes and deletions of data results in leaving separated unnecessary areas in the flash memory. Hence, the flash memory is required to execute the process of erasing these unnecessary areas and collecting the areas being used into a set of sequential areas for increasing the amount of areas on which data are to be stored. This process will be called a garbage collection. (For example, refer to the paragraph numbers [0023] to [0027] and FIG. 1 of the Japanese Unexamined Patent Publication No. 2000-278730.)

FIG. 18 shows a flow of process to be executed when data is rewritten in the conventional flash memory.

The following process is executed under the control of the CPU (Central Processing Unit) installed outside of the flash memory.

When the process is started, at first, the CPU determines if the process is for writing data or for nullifying data (S100). If it is for writing, the CPU executes the process of writing data (S101), while if it is for nullifying, the CPU executes the process of nullifying data (S102). Then, the CPU updates the management data (S103) and then calculates an area usage ratio of the flash memory (S104). Then, the CPU determines if the garbage collection is necessary according to the calculated result of the area usage ratio (S105). If necessary, the CPU executes the garbage collection process (S106), while if not necessary, the CPU terminates the process without doing any process.

As noted above, however, after rewriting data in the flash memory, in some cases, the CPU executes the garbage collection process that needs a considerably long processing time. Hence, this garbage collection process disadvantageously makes the overall processing time of the device such as a portable phone considerably longer.

This disadvantage may be solved by executing the data rewriting process and the garbage collection process of the flash memory on their respective timings. For this purpose, it is necessary to obtain the proper timing on which the garbage collection process is executed.

SUMMARY OF THE INVENTION

The present invention is made in consideration of the foregoing respects, and it is an object of the present invention to provide a flash memory which is arranged to report a timing on which unnecessary data is erased for the garbage collection to the outside.

It is another object of the present invention to provide a method for controlling a flash memory that is arranged to notice the timing on which unnecessary data is erased for the garbage collection to the outside.

In carrying out the foregoing former object, a flash memory is provided which includes a memory cell array composed of a plurality of user areas each for storing data and a plurality of flag areas each for indicating a state of each user area. This flash memory is composed of a state information generator for generating the state information of each user area to be notified to the outside by referring to the corresponding flag area and an output unit for outputting the state information.

In carrying out the foregoing latter object, a memory control method is provided which controls the operation of the flash memory including a memory cell array composed of a plurality of user areas each for storing data and a plurality of flag areas each for indicating the state of each user area. This memory control method comprises the steps of receiving information that indicates the garbage collection is necessary from the flash memory and executing the garbage collection with respect to the flash memory according to the received information.

The above and other objects, features and advantages of the present invention will become apparent from the following description when taken in conjunction with the accompanying drawings which illustrate preferred embodiments of the present invention by way of example.

DESCRIPTION OF THE PREFERRED EMBODIMENTS

Hereafter, the embodiments of the present invention will be described with reference to the appended drawings.

Figure 1:
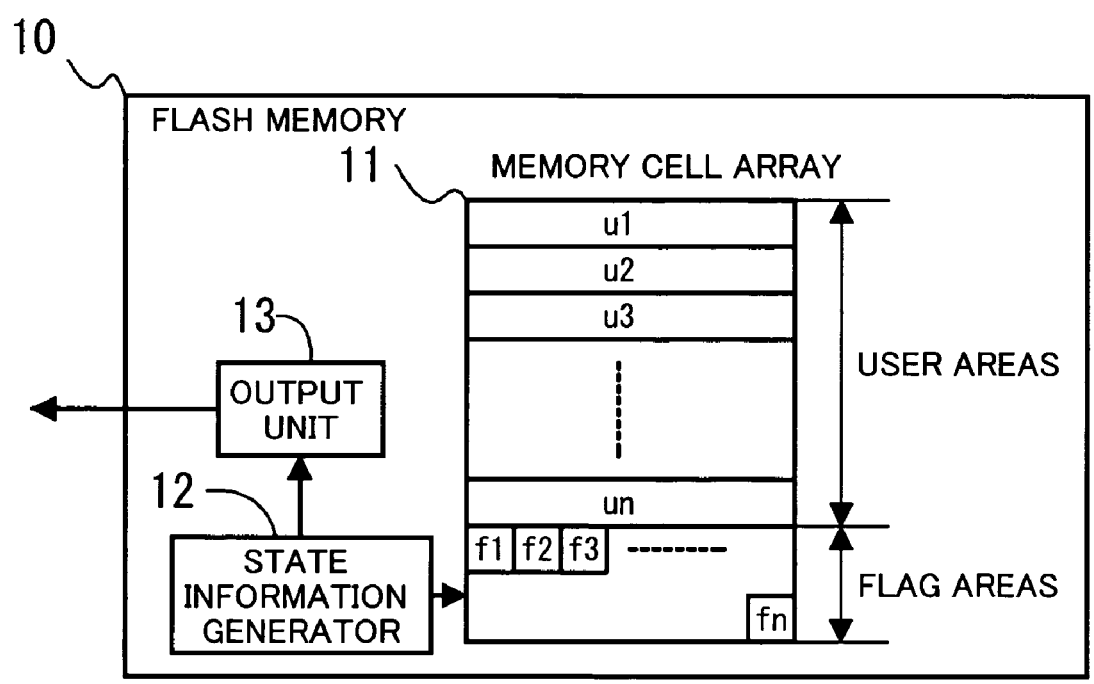
FIG. 1 is a diagram for explaining the principle of a flash memory according to the present invention.

FIG. 1 is a diagram showing a principle of a flash memory according to the present invention.

A flash memory 10 includes a memory cell array 11, a state information generator 12, and an output unit 13. The memory cell array 11 is composed of a plurality of user areas u1, u2, u3, . . . , un each of which stores data and a plurality of flag areas f1, f2, f3, . . . , fn each of which indicates the state of the corresponding one of the user areas u1, u2, u3, . . . , un. The state information generator 12 generates the state information for indicating a state of each user area for noticing the state to the outside by referring to the flag areas f1, f2, f3, . . . , fn. The output unit 13 outputs the state information.

In the following description, the plurality of user areas u1, u2, u3, . . . , un are called a user area ux (x is an integer of 1 or more). The plurality of flag areas fy is called a flag area fy (y is an integer of 1 or more).

The operation of the flash memory 10 will be described below.

In the memory cell array 11, when data is written on the user area ux, the flag area fy for the user area ux indicates a valid value. When data is nullified, the flag area fy indicates an invalid value. The state information generator 12 generates state information for indicating the state of the corresponding user area ux with the flag area fy, which will be notified to the outside, by referring to the value of the flag area fy. The state information is, for example, a ratio of the user areas ux from which data are nullified (which will be discussed in detail below). Then, the output unit 13 supplies the generated state information to the outside of the flash memory 10.

In this operation, a control unit (not shown) such as a CPU, located outside the flash memory 10 where the garbage collection is executed, enables to easily grasp the state of the flash memory (such as a ratio of the data-nullified user areas ux). Hence, the control unit enables to determine if the garbage collection process is to be executed, based on the grasped state of the flash memory.

Hereafter, the embodiments of the present invention will be described.

At first, the description will be oriented to the flash memory according to the first embodiment of the present invention.

Figure 2:
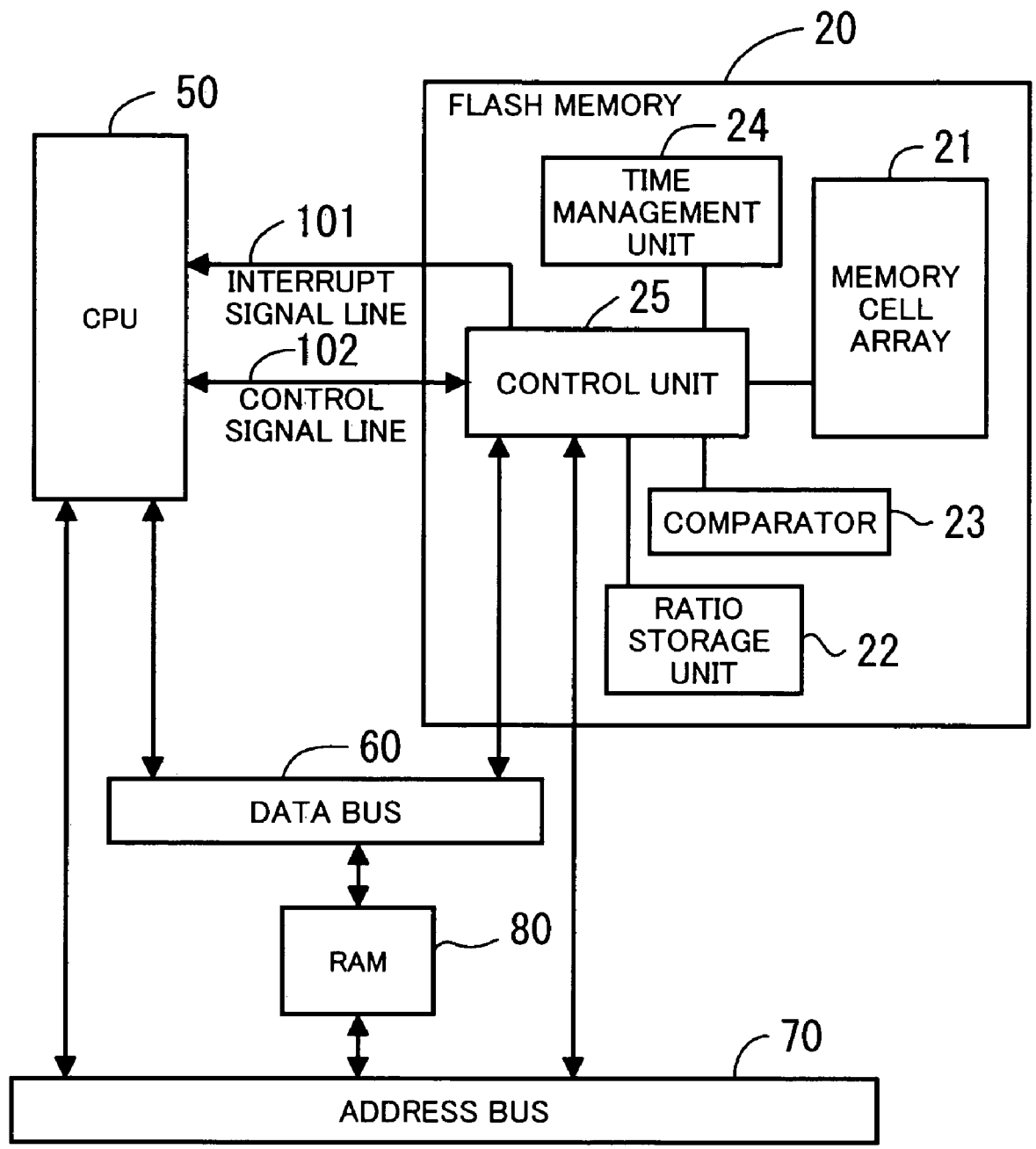
FIG. 2 is a circuit diagram showing a flash memory according to a first embodiment of the present invention and a circuit installed outside the flash memory.

FIG. 2 is a circuit diagram showing a flash memory according to the first embodiment of the present invention and a circuit located outside the flash memory. The flash memory 20 according to the first embodiment is composed of a memory cell array 21, a ratio storage unit 22, a comparator 23, a time management unit 24, and a control unit 25.

As described with reference to FIG. 1, the memory cell array 21 is composed of the plurality of user areas ux and the plurality of flag areas fy. The flag area fy has 2-bit information for each user area ux. If the flag area fy has a value of "00," it indicates that the data on the corresponding user ux with the flag area fy is erased. If the flag area fy has a value of "01," it indicates that the data on the corresponding user area ux with the flag area fy is valid. If the flag area fy has a value of "11," it indicates that the data on the corresponding user area ux with the flag area fy is invalid. In the memory cell array 21 of the flash memory 20 before being used, data are not written on all user areas ux. Further, the value of "00" that indicates data is erased is written on all flag areas fy of the memory cell array 21.

The ratio storage unit 22 pre-stores a predetermined ratio. For example, a ratio of "80%" is pre-stored.

The comparator 23 determines the state of the flag area fy of the memory cell array 21, calculates the ratio of user areas ux from which data are nullified, and then compares the calculated ratio with the ratio stored in the ratio storage unit 22.

The time management unit 24 sends a signal to the control unit 25 at regular time intervals, for example, at regular intervals of 60 seconds.

The control unit 25 controls each component of the flash memory 20 for transfer of information with the outside. The control unit 25 is connected with a CPU 50 through an interrupt signal line 101 and a control signal line 102. Further, the control unit 25 is connected with a data bus 60 and an address bus 70.

The CPU 50 is also connected with the data bus 60 and the address bus 70. The data bus is connected with the address bus 70 through a RAM (Random Access Memory) 80. The CPU 50 reads and writes data on and from the flash memory 20 and the RAM 80 through the use of the data bus 60 and the address bus 70 and executes the program written in the RAM 80.

In the first embodiment, the function of the state information generator 12 shown in FIG. 1 is included in the comparator 23. The function of the output unit 13 is included in the control unit 25.

Later, the description will be oriented to the operation shown in FIG. 1 and the operation of the flash memory according to the first embodiment of the invention.

At first, the writing operation will be described.

Figure 3:
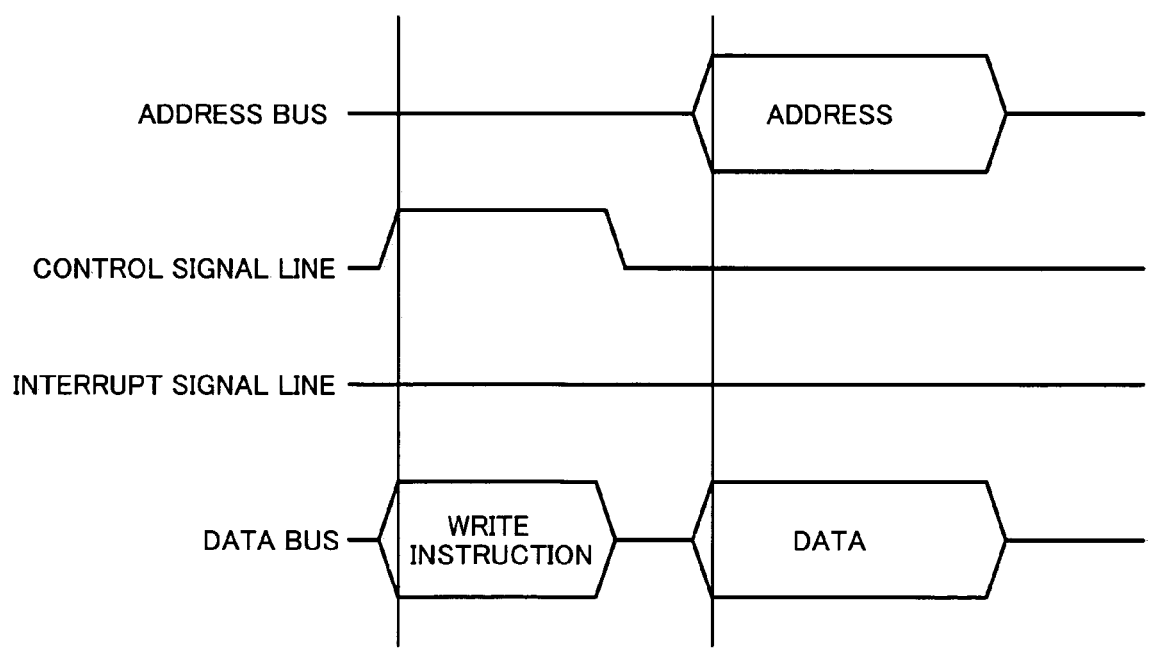
FIG. 3 is a chart showing a timing when data is written in the flash memory.

FIG. 3 is a chart illustrating a timing when data is written in the flash memory. This timing chart illustrates the states of the signals passing on the address bus 70, the control signal line 102, the interrupt signal line 101 and the data bus 60 appearing in the process of writing data in the flash memory.

In a case that the data written in the RAM 80 is written in the flash memory 20, the CPU 50 shifts the signal of the control signal line 102 to a "H (High)" level and sends a write instruction to the control unit 25 through the data bus 60. Afterwards, the CPU 50 returns the signal of the control signal line 102 into a "L (Low)" level. Further, the CPU 50 sends the data read from the RAM 80 to the control unit 25 through the data bus 60. The CPU 50 sends the address of the writing destination to the control unit 25 through the address bus 70.

When the signal passing on the control signal line 102 is at the "H" level as shown in FIG. 3, the control unit 25 of the flash memory 20 receives a data write instruction from the data bus 60. Then, the control unit 25 receives data from the data bus 60 and an address from the address bus 70 and then writes the data onto the user area ux of the memory cell array 21 specified by the received address. Further, the control unit 25 writes a value that indicates the data is valid, that is, a value of "01" onto the corresponding flag area fy with the user area ux.

In turn, the description will be oriented to the nullifying process and the operation of deleting data.

Figure 4:
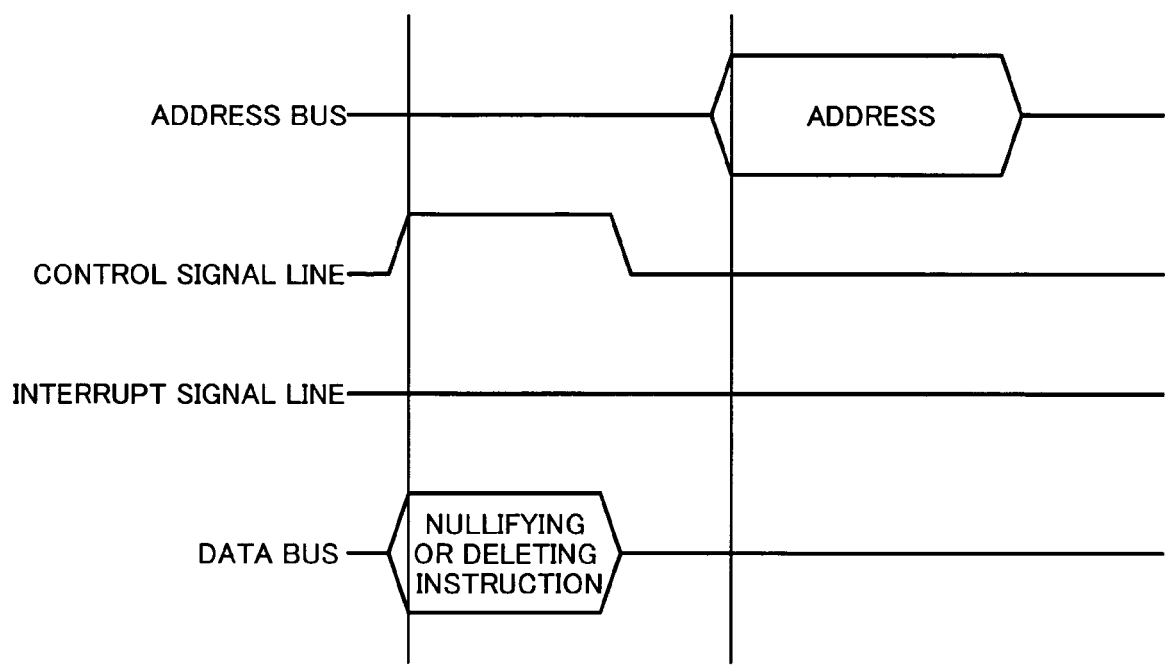
FIG. 4 is a chart showing a timing when data is nullified (or deleted) from the flash memory.

FIG. 4 is a chart illustrating a timing when the data stored in the flash memory is nullified (or deleted).

In nullifying (or deleting) data in the flash memory, the timing chart illustrates the signal states of the address bus 70, the control signal line 102, the interrupt signal line 101 and the data bus 60.

In the case of nullifying (or deleting) the data written in the flash memory 20, the CPU 50 shifts the signal of the control signal line 102 to the "H" level and sends an instruction of nullifying the data to the control unit 25 of the flash memory 20 through the data bus 60. Afterwards, the CPU 50 returns the signal of the control signal line 102 into the "L" level. Further, the CPU 50 sends the address of the data to be nullified to the control unit 25 through the address bus 70.

When the signal passing on the control signal line 102 is at the "H" level as shown in FIG. 4, the control unit 25 of the flash memory 20 receives a nullifying (or deleting) instruction from the data bus 60. Then, the control unit 25 writes a value of "11" that indicates data is invalid in the corresponding flag area fy with the user area ux of the memory cell array 21 specified by the address received from the address bus 70. In the case of deleting the data, the control unit 25 deletes the data from the user area ux of the memory cell array 21 specified by the received address and then writes a value of "00" that indicates data is erased on the corresponding flag area fy with the user area ux from which the data is deleted.

In turn, the description will be oriented to the operation of the feature components of this embodiment.

In the flash memory 20, as stated above, a time management unit 24 sends a signal to the control unit 25 at regular time intervals, for example, at regular intervals of 60 seconds. In receipt of the signal from the time management unit 24, the control unit 25 reads the data of the flag area fy and then sends the read data to the comparator 23. In receipt of the data of the flag area fy, the comparator 23 counts the number of data units that are specified to be invalid by the data of the flag area fy, for deriving a ratio of user areas ux with invalid data. Further, the comparator 23 compares the derived ratio with the ratio pre-stored in the ratio storage unit 22, for example, "80%." As a result of the comparison, if the derived ratio is larger than the pre-stored ratio, the comparator 23 sends a signal to the control unit 25.

In receipt of the signal from the comparator 23, the control unit 25 sends an interrupt signal to the CPU 50 through the interrupt signal line 101.

Figure 5:
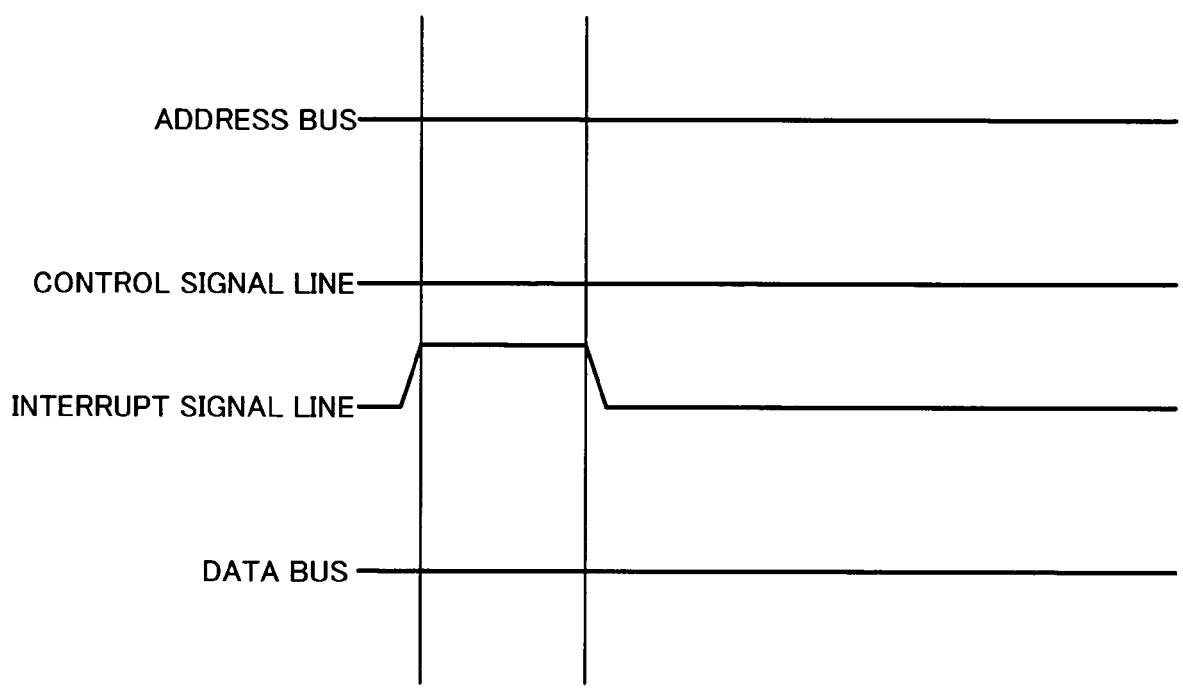
FIG. 5 is a chart showing a timing when an interrupt signal is outputted to the outside.

FIG. 5 is a chart illustrating a timing when the interrupt signal is outputted to the outside. This timing chart illustrates the signal levels of the address bus 70, the control signal line 102, the interrupt signal line 101 and the data bus 60.

In FIG. 5, the signal passing on the interrupt signal line 101 rises to the "H" level, when the interrupt signal is sent to the CPU 50. This interrupt signal indicates to the outside that the flash memory 20 needs the garbage collection.

In receipt of the interrupt signal, the CPU 50 executes a program for executing the garbage collection, which program is stored in the RAM 80. This program is executed to carry out the garbage collection of erasing unnecessary data from the flash memory 20 and thereby increasing an empty area.

In addition, the ratio pre-stored in the ratio storage unit 22 may be rewritten.

Figure 6:
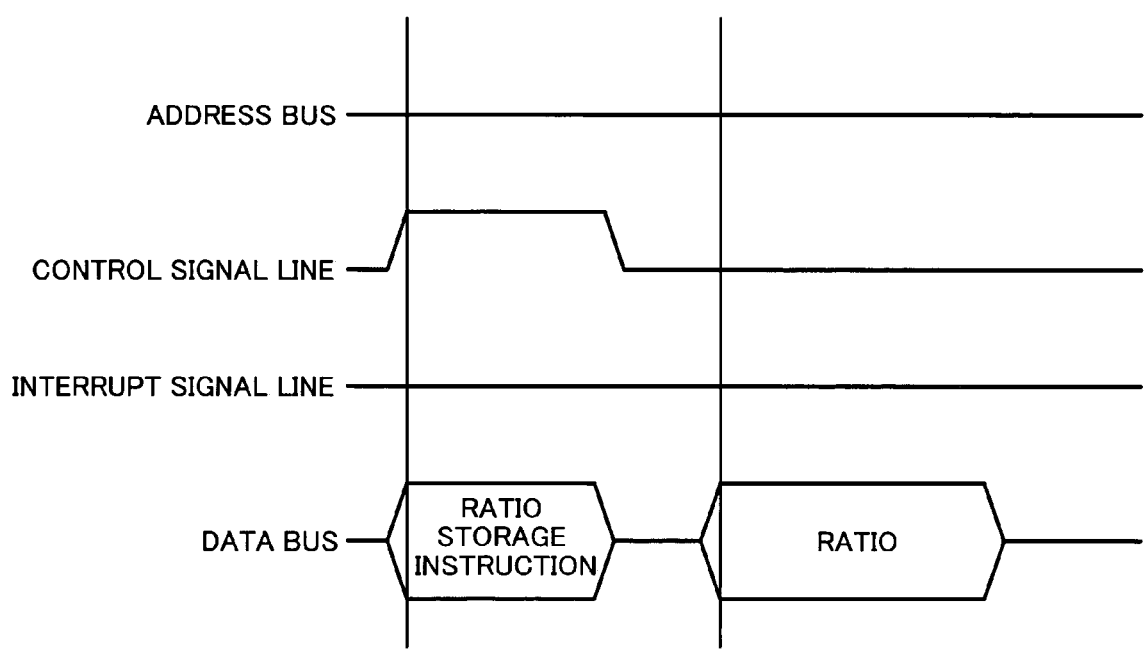
FIG. 6 is a chart showing a timing when a ratio is rewritten.

FIG. 6 is a chart illustrating a timing when a ratio is rewritten. The timing chart illustrates the signal levels of the address bus 70, the control signal line 102, the interrupt signal line 101 and the data bus 60 appearing in the process of rewriting the ratio.

In the case of rewriting the ratio stored in the ratio storage unit 22 of the flash memory 20, as shown in FIG. 6, at first, the CPU 50 shifts the signal passing on the control signal line 102 to the "H" level and at once sends a ratio storage instruction to the control unit 25 of the flash memory 20 through the data bus 60. Afterwards, the CPU 50 returns the signal level of the control signal line 102 to the "L" level. Then, the data of the ratio for rewrite stored in the RAM 80 is sent to the control unit 25.

When the signal passing on the control signal line 102 is at the "H" level, the control unit 25 is inputted with the ratio storage instruction through the data bus 60 and then the data of the rewrite ratio also through the data bus 60. The control unit 25 sends the data of the received rewrite ratio to the ratio storage unit 22, in which the rewrite ratio data is stored.

The foregoing flow of the operation of the first embodiment is summarized in the flowchart.

Figure 7:
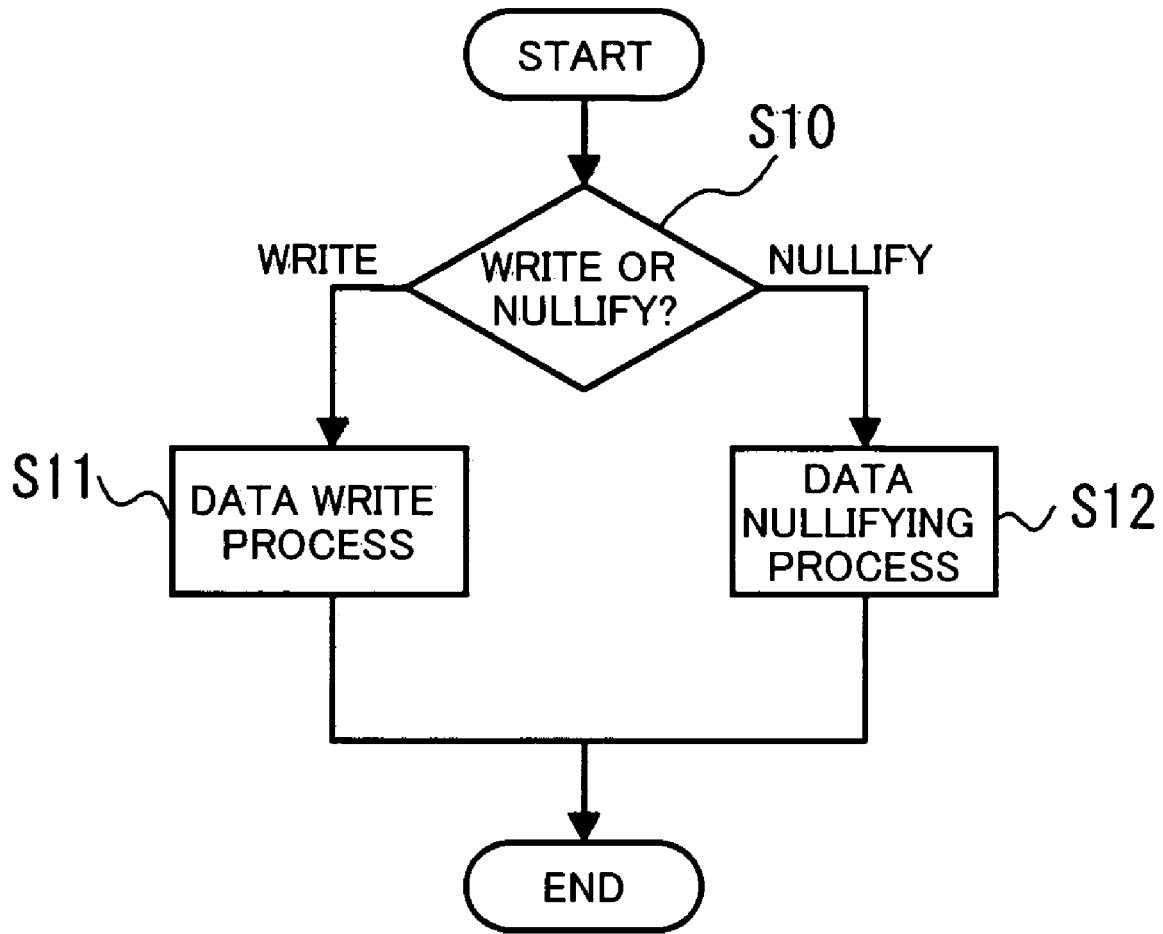
FIG. 7 is a flowchart showing a flow of process to be executed when data in the flash memory is rewritten.

FIG. 7 is a flowchart showing a flow of process to be executed in rewriting the data of the flash memory.

S10: Process of Determining if the Data is to be Written or Nullified

When the process is started, the CPU 50 determines if the process to be executed is the process of writing data or the process of nullifying data. If it is the process of writing data, the process goes to step S11, while if it is the process of nullifying data, the process goes to step S12.

S11: Process of Writing Data

In the step S10, it is determined that the process to be executed is the process of writing data. Hence, the process of writing data is started.

S12: Process of Nullifying Data

In the step S10, it is determined that the process to be executed is the process of nullifying data. Hence, the process of nullifying data is started.

Upon termination of the process of the step S11 or S12, the CPU 50 terminates the process of rewriting the data stored in the flash memory 20.

Figure 8:
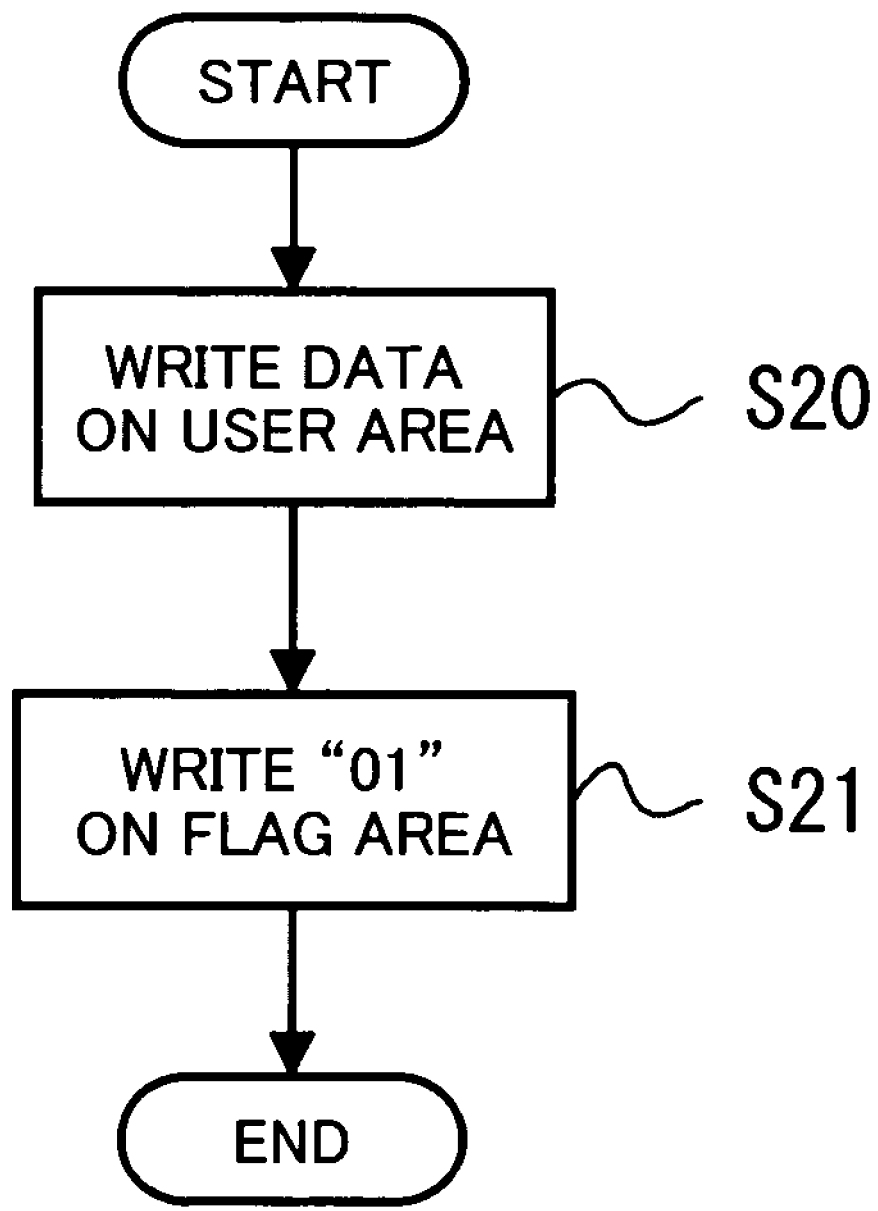
FIG. 8 is a flowchart showing a flow of process to be executed in the data write process.

FIG. 8 is a flowchart illustrating a flow of process to be executed in the data writing operation.

S20: Process of Writing Data on the User Area

When the data write process is started, the control unit 25 of the flash memory 20 writes data at the specified address of the user area ux of the memory cell array 21 on the timing as shown in FIG. 3.

S21: Process of Writing Data of "01" on the Flag Area

When the process of writing data on the user area ux is executed in the step S20, the control unit 25 writes a value of "01" that indicates the data is valid onto the corresponding flag area fy with the user area ux where the data is written.

Figure 9:
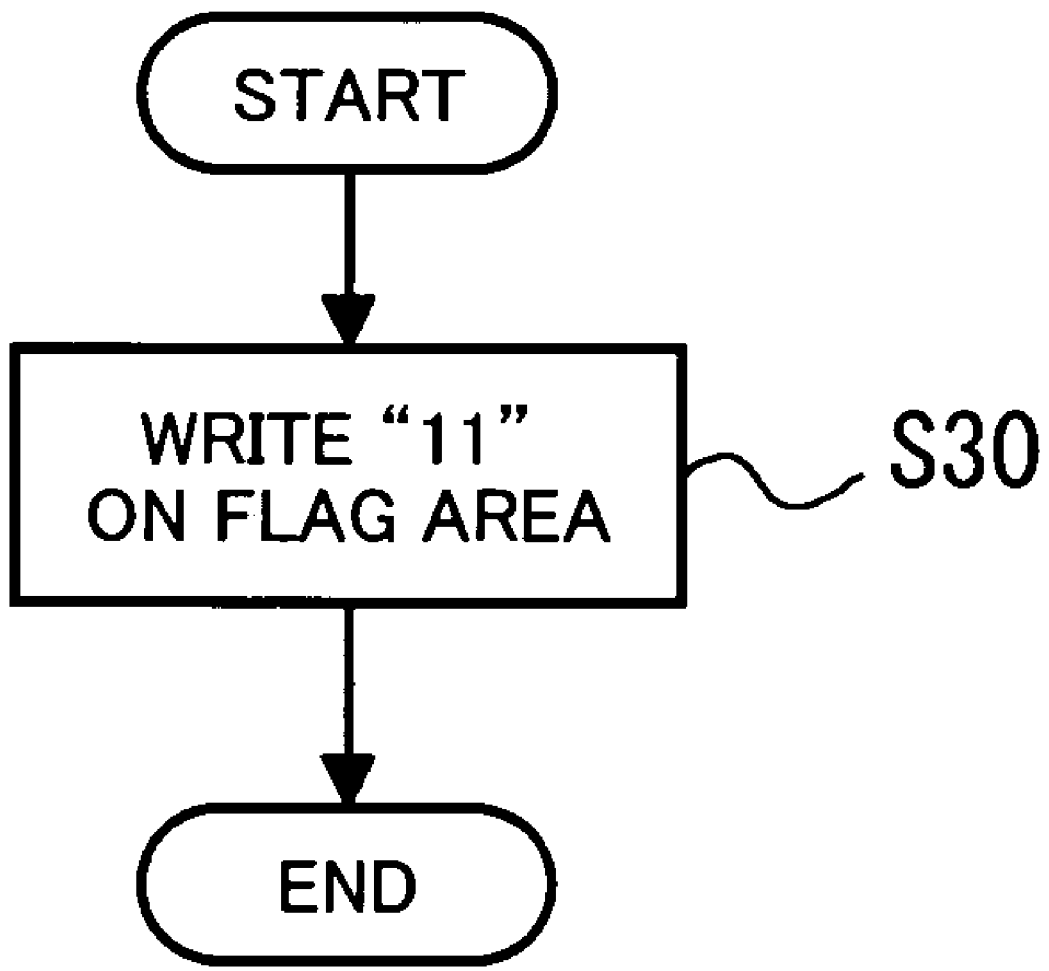
FIG. 9 is a flowchart showing a data nullifying process.

FIG. 9 is a flowchart illustrating the process of nullifying data.

S30: Process of Writing a Value of "11" onto the Flag Area

When the nullifying process is started, the control unit 25 of the flash memory 20 writes a value of "11" that indicates the data is invalid onto the corresponding flag area fy with the user area ux to be nullified, included in the memory cell array 21, on the timing as shown in FIG. 4. Then, the nullifying process is terminated.

Figure 10:
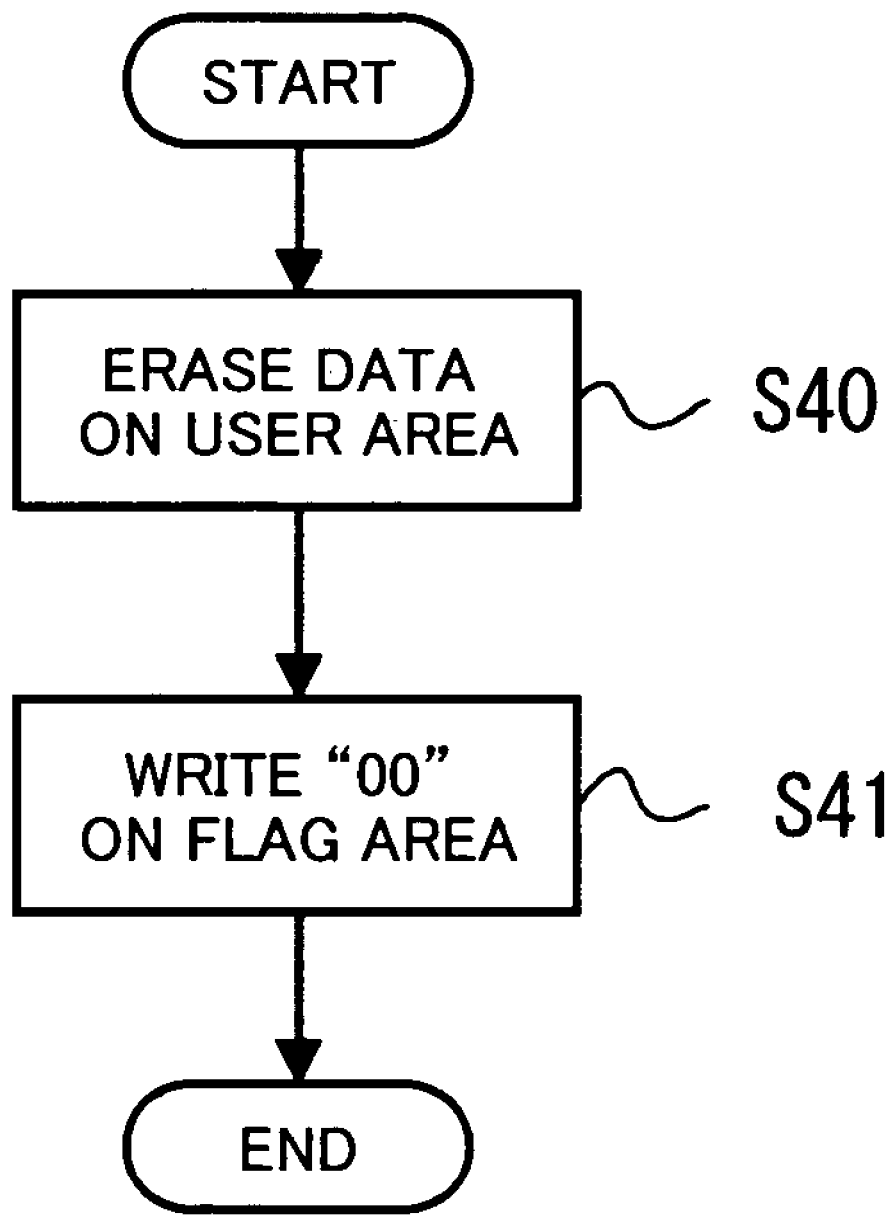
FIG. 10 is a flowchart showing a flow of process for erasing data.

FIG. 10 is a flowchart illustrating a flow of process of erasing data.

S40: Process of Erasing Data From the User Area

When the process of erasing data is started, the control unit 25 of the flash memory 20 erases the data at the specified address of the user area ux included in the memory cell array 21 on the timing as shown in FIG. 4.

S41: Process of Writing a Value of "00" onto the Flag Area

The control unit 25 writes a value of "00" that indicates the data is erased onto the corresponding flag area fy with the user area ux from which the data has been erased. Then, the control unit 25 terminates the process of erasing data.

Figure 11:
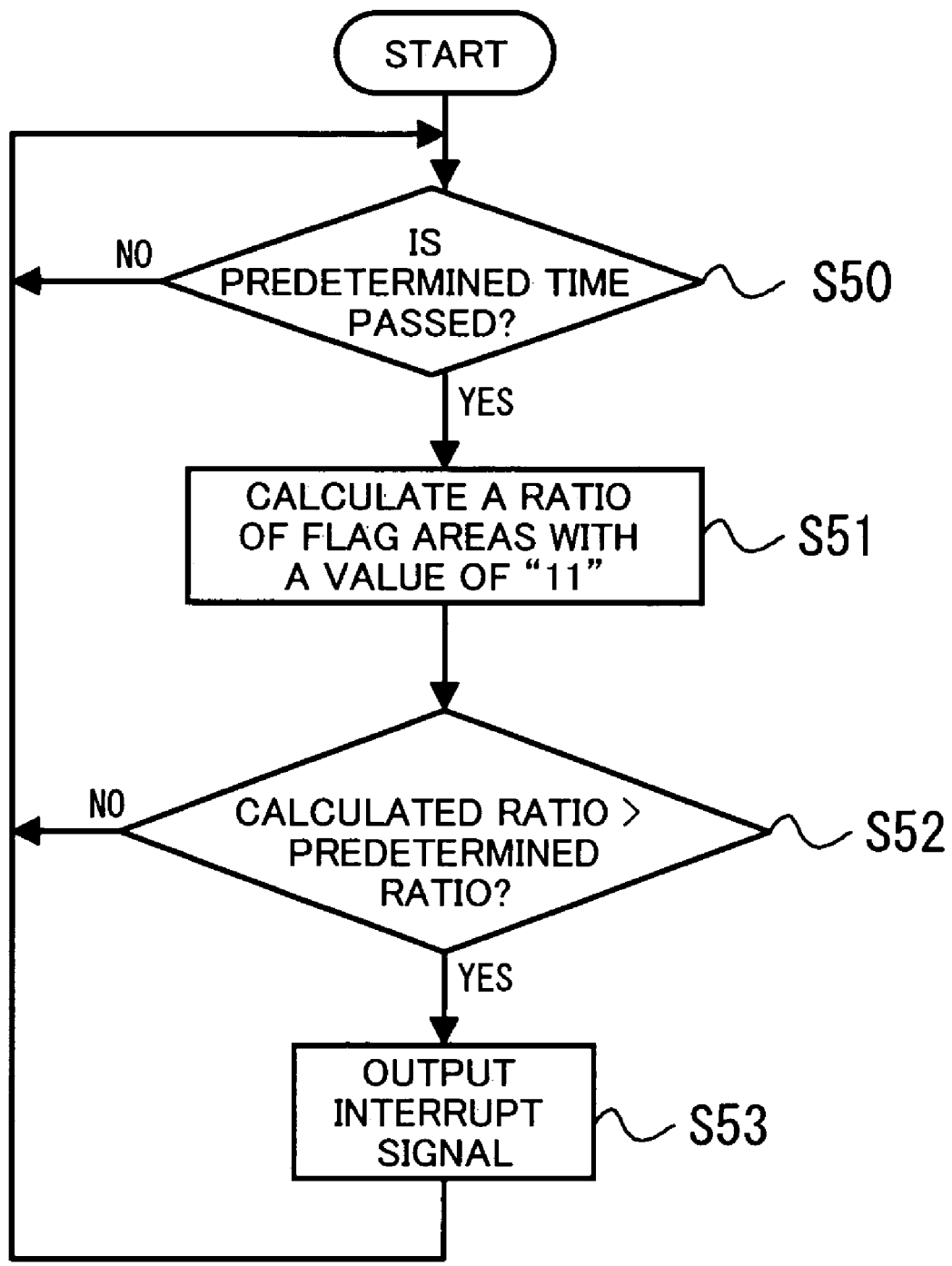
FIG. 11 is a flowchart showing a flow of process in the flash memory to be executed when outputting an interrupt signal.

FIG. 11 is a flowchart illustrating a flow of process in the flash memory to be executed in outputting the interrupt signal.

S50: Process of Determining if a Predetermined Time is Passed

The control unit 25 receives the signal outputted from the time management unit 24 at regular intervals and determines if a predetermined length of time (for example 60 seconds) is passed. If it is determined that a predetermined length of time has passed, the process goes to step S51, while if it is determined that a predetermined length of time have not passed, that is, the control unit 25 does not receive any signal from the time management unit 24, the process of the step S50 is repeated.

S51: Process of Calculating a Ratio of the Data "11" on the Flag Area

The control unit 25 causes the comparator 23 to calculate a ratio of the flag areas fy each with a value of "11" that indicate the data on the user area ux is invalid.

S52: Process of Determining if the Calculated Ratio is Larger than the Predetermined Ratio Then, the control unit 25 reads the predetermined ratio pre-stored in the ratio storage unit 22 and then sends the predetermined ratio to the comparator 23. In this comparator 23, the ratio calculated in the process of the step S51 is compared with the predetermined ratio. If the calculated ratio is larger than the predetermined ratio (for example, 80%), the process goes to step S53, while if it is not, the process goes to step S50.

S53: Process of Outputting the Interrupt Signal

Figure 12:
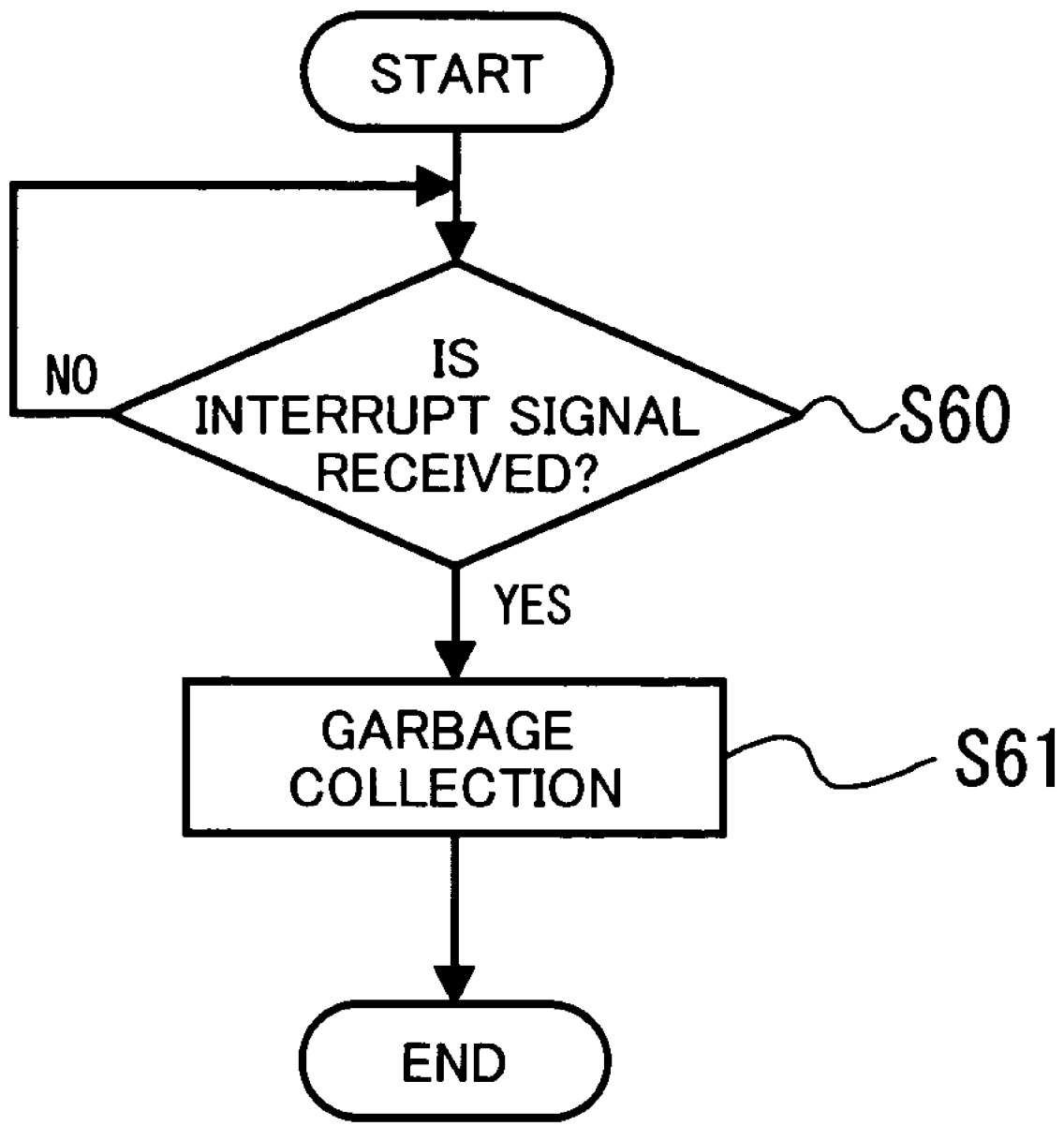
FIG. 12 is a flowchart showing a flow of a garbage collection process.

Since the nullifying ratio is larger, the control unit 25 outputs the interrupt signal to the outside and requires the garbage collection. Afterwards, the control unit 25 repeats the process from the step S50. FIG. 12 is a flowchart illustrating a flow of the garbage collection process.

S60: Process of Determining if the Interrupt Signal is Received

The CPU 50 of the flash memory 20 determines if the interrupt signal for requesting execution of the garbage collection is received. If it is determined that the signal is received, the process goes to step S61, while if it is determined that the signal is received, the process goes to the step S60.

S61: Garbage Collection Process

The CPU 50 executes the garbage collection process with respect to the flash memory 20.

The garbage collection process is executed to erase unnecessary data from the user area ux, collect valid areas as sequential areas, and thereby increase the usable area.

As described above, the use of the flash memory 20 of the first embodiment allows the program of rewriting data on the flash memory 20 and the program of executing the garbage collection to be executed independently by the CPU 50. The flash memory 20 of the first embodiment causes the timing when the garbage collection program is to be executed to be notified as the interrupt signal to the outside.

In turn, the description will be oriented to the flash memory according to the second embodiment of the present invention.

Figure 13:
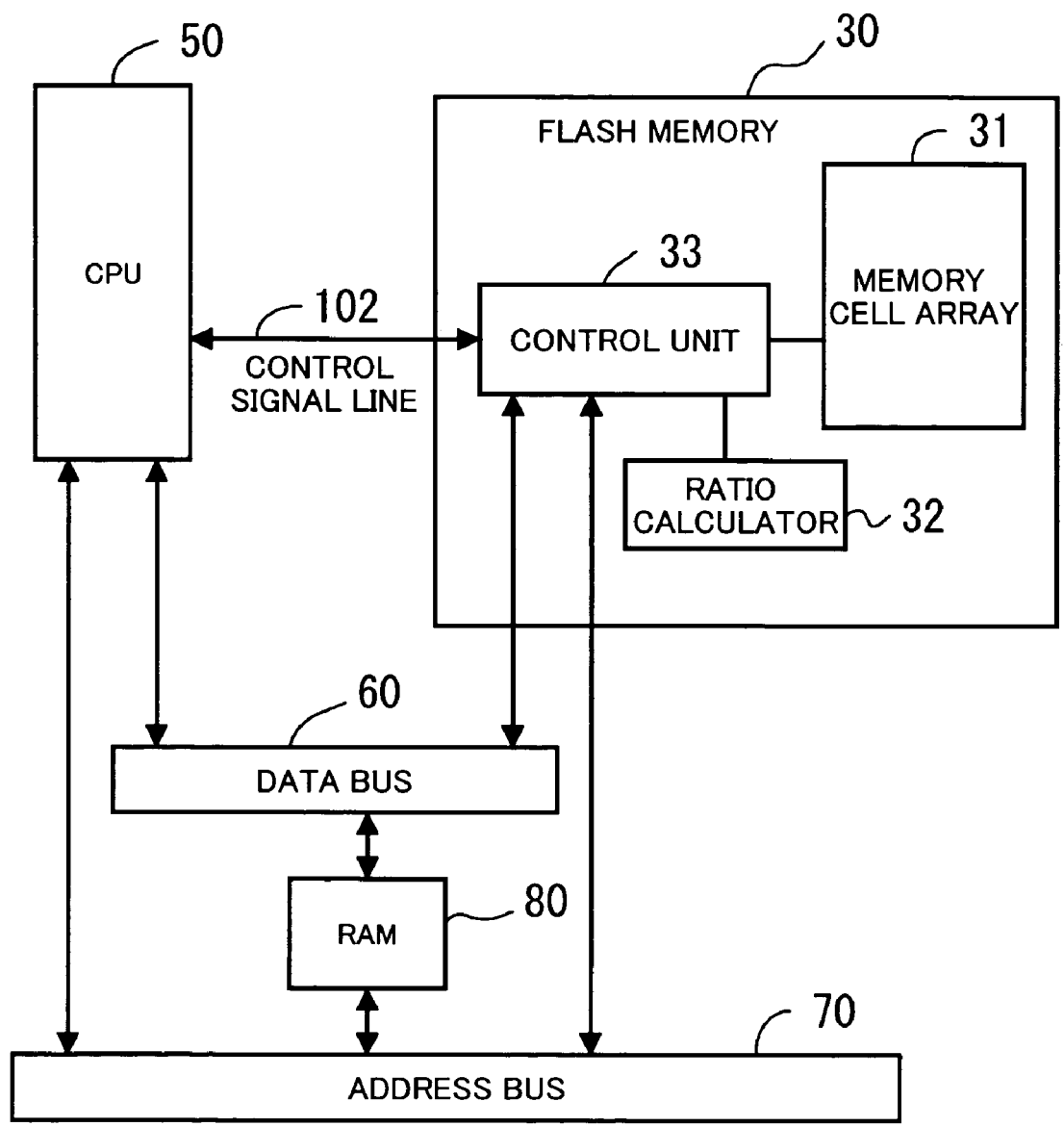
FIG. 13 is a circuit diagram showing a flash memory according to a second embodiment and a circuit located outside the flash memory.

FIG. 13 is a circuit diagram showing the flash memory of the second embodiment and a circuit installed outside the flash memory.

The flash memory 30 of the second embodiment is composed of a memory cell array 31, a ratio calculator 32, and a control unit 33.

Like the first embodiment, the memory cell array 31 is composed of a plurality of user areas ux and the corresponding plurality of flag areas fy.

The ratio calculator 32 determines the state of the flag area fy of the memory cell array 31, calculates the ratio of the user areas ux with valid data, and then sends the calculated ratio to the control unit 33.

The control unit 33 controls each component of the flash memory 30 for transfer of information with the outside. The control unit 33 is connected with the CPU 50 through the control signal line 102 and further with the data bus 60 and the address bus 70. Moreover, the control unit 33 receives the ratio calculated by the ratio calculator 32 and then outputs the ratio to the outside immediately after the data write process or the nullifying process.

The components of the circuit installed outside the flash memory 30 are indicated by the same reference numbers as those of the first embodiment and thus are not described because they are the same as those of the first embodiment. In the second embodiment, the function of the state information generator 12 shown in FIG. 1 is included in the ratio calculator 32. The function of the output unit 13 is included in the control unit 33.

The flash memory 30 of the second embodiment is different from the flash memory 20 of the first embodiment in a respect that the ratio itself calculated by the ratio calculator 32 is outputted to the outside by the control unit 33, in particular, a respect that the time management unit 24 is removed and thereby the ratio is outputted to the outside immediately after the data write process or the nullifying process.

Hereafter, the description will be oriented to the operation of the flash memory of the second embodiment.

Figure 14:
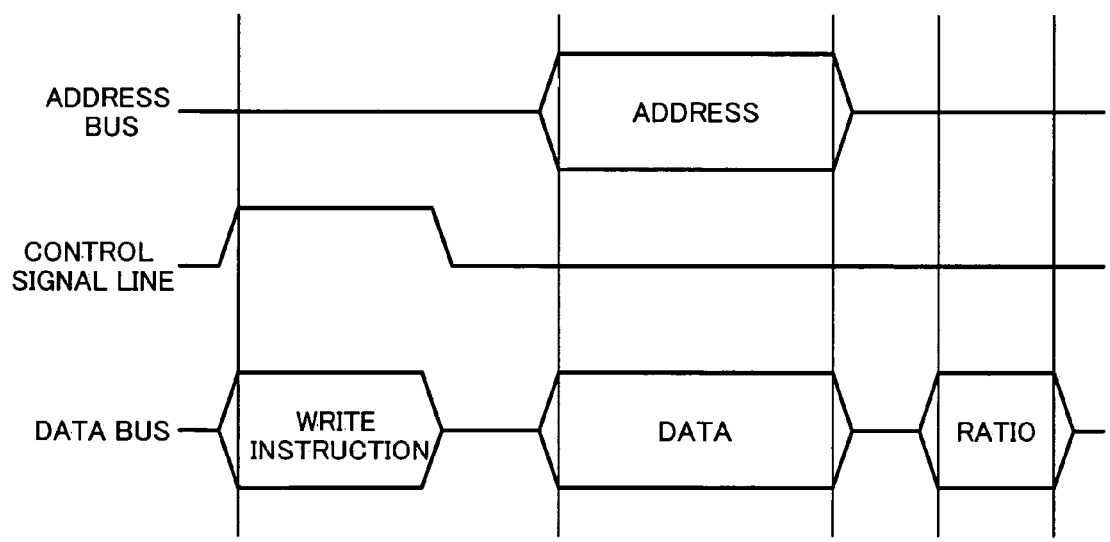
FIG. 14 is a chart showing a timing when a ratio is outputted after the data write process.

FIG. 14 is a chart illustrating a timing when a ratio is outputted after the data write process. This timing chart illustrates the states of the signals passing on the address bus 70, the control signal line 102 and the data bus 60 appearing when the ratio is outputted after the data write process.

The control unit 33 of the flash memory 30 receives a write instruction from the data bus 60 when the signal passing on the control signal line 102 rises to the "H" level as shown in FIG. 14. Then, the control unit 33 writes the data received through the data bus 60 on the user area ux of the memory cell array 31 specified by the address received from the address bus 70. Further, the value of "01" that indicates the data is valid is written on the corresponding flag area fy with that user area. Afterwards, the ratio calculator 32 determines the state of the flag area fy and calculates a ratio of the user areas ux with invalid data. The control unit 33 receives the ratio calculated by the ratio calculator 32 and outputs the calculated ratio to the data bus 60 for noticing it to the outside.

Figure 15:
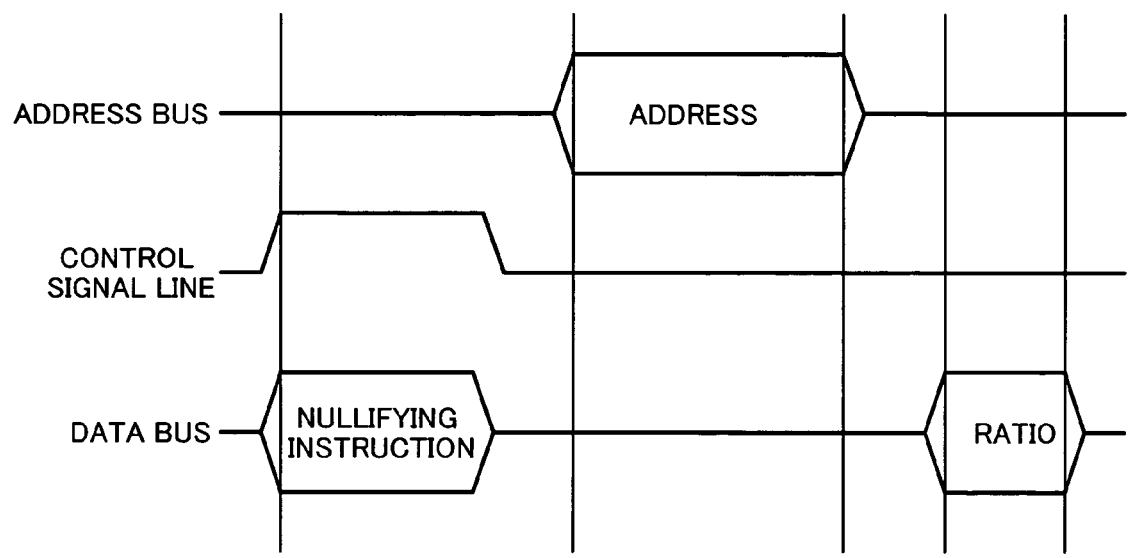
FIG. 15 is a chart showing a timing when a ratio is outputted after the data nullifying process.

FIG. 15 is a chart illustrating a timing when a ratio is outputted after the data nullifying process. This timing chart illustrates the states of the signals passing on the address bus 70, the control signal line 102 and the data bus 60 appearing when the ratio is outputted after the data nullifying process.

The control unit 33 of the flash memory 30 receives a nullifying instruction from the data bus 60 when the signal passing on the control signal line 102 rises to the "H" level as shown in FIG. 15. Then, the control unit 33 writes a value of "11" that indicates the data is invalid on the corresponding flag area fy with the user area ux of the memory cell array 31 specified by the address received from the address bus 70. Afterwards, the ratio calculator 32 determines the state of the flag area fy and calculates a ratio of the user areas ux with invalid data. The control unit 33 receives the ratio calculated by the ratio calculator 32 and outputs the calculated ratio to the data bus 60 for noticing it to the outside.

Figure 16:
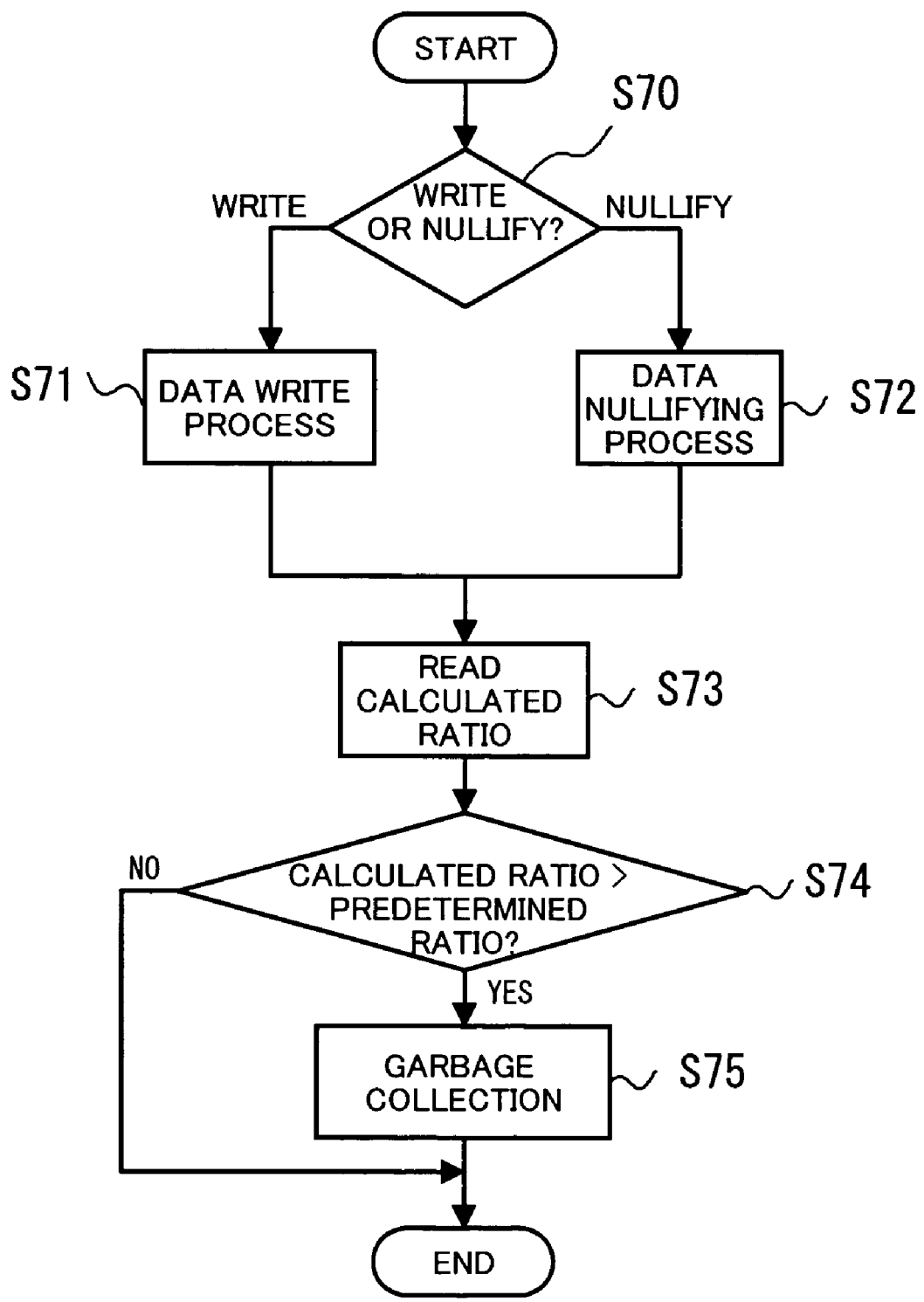
FIG. 16 is a flowchart showing a flow of process to be executed in the arrangement according to the second embodiment of the present invention.

FIG. 16 is a flowchart showing a flow of process to be executed in the second embodiment.

S70: Process of Determining if the Operation is for Writing Data or for Nullifying Data.

When the process is started, the CPU 50 determines if the operation is for writing data or for nullifying data. For writing data, the process goes to step S71, while for nullifying data, the process goes to step S72.

S71: Process of Writing Data

Since it is determined that the process of writing data is started in the step S70, this process is executed.

S72: Process of Nullifying Data

Since it is determined that the process of nullifying data is started in the step S70, this process is executed.

S73: Process of Reading a Calculated Ratio

The CPU 50 reads the ratio calculated and outputted by the flash memory 30 immediately after the data write or nullifying process through the data bus 60.

S74: Process of Determining if the Calculated Ratio is Larger than a Predetermined Ratio Then, the CPU 50 determines if the calculated ratio is larger than the predetermined ratio (for example, 80%) pre-stored in the RAM 80. If it is larger, the process goes to step S75, while if it is not larger, the process is terminated.

S75: Garbage Collection Process

If the ratio notified by the flash memory 30 is larger than the predetermined ratio, the CPU 50 determines the garbage collection process is necessary and starts this process.

As set forth above, the flash memory 20 of the second embodiment is arranged to output the ratio immediately after the data write process or the data nullifying process. Hence, unlike the first embodiment, the interrupt signal line 101 is not necessary.

In turn, the description will be oriented to a third embodiment of the present invention.

The arrangement of the third embodiment is the same as that of the second embodiment shown in FIG. 13. Hence, it is not described herein.

The third embodiment is different from the second embodiment in a respect that the CPU 50 transmits a ratio output instruction for requiring a ratio to the flash memory 20.

Figure 17:
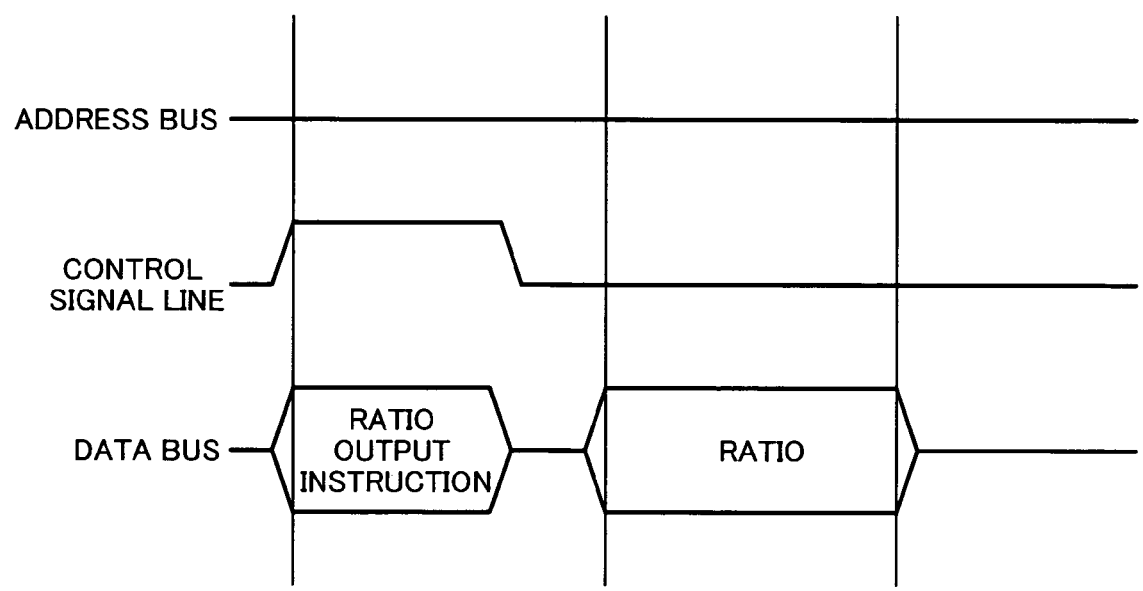
FIG. 17 is a chart showing a timing when a ratio is outputted in response to a ratio instruction.
Figure 18:
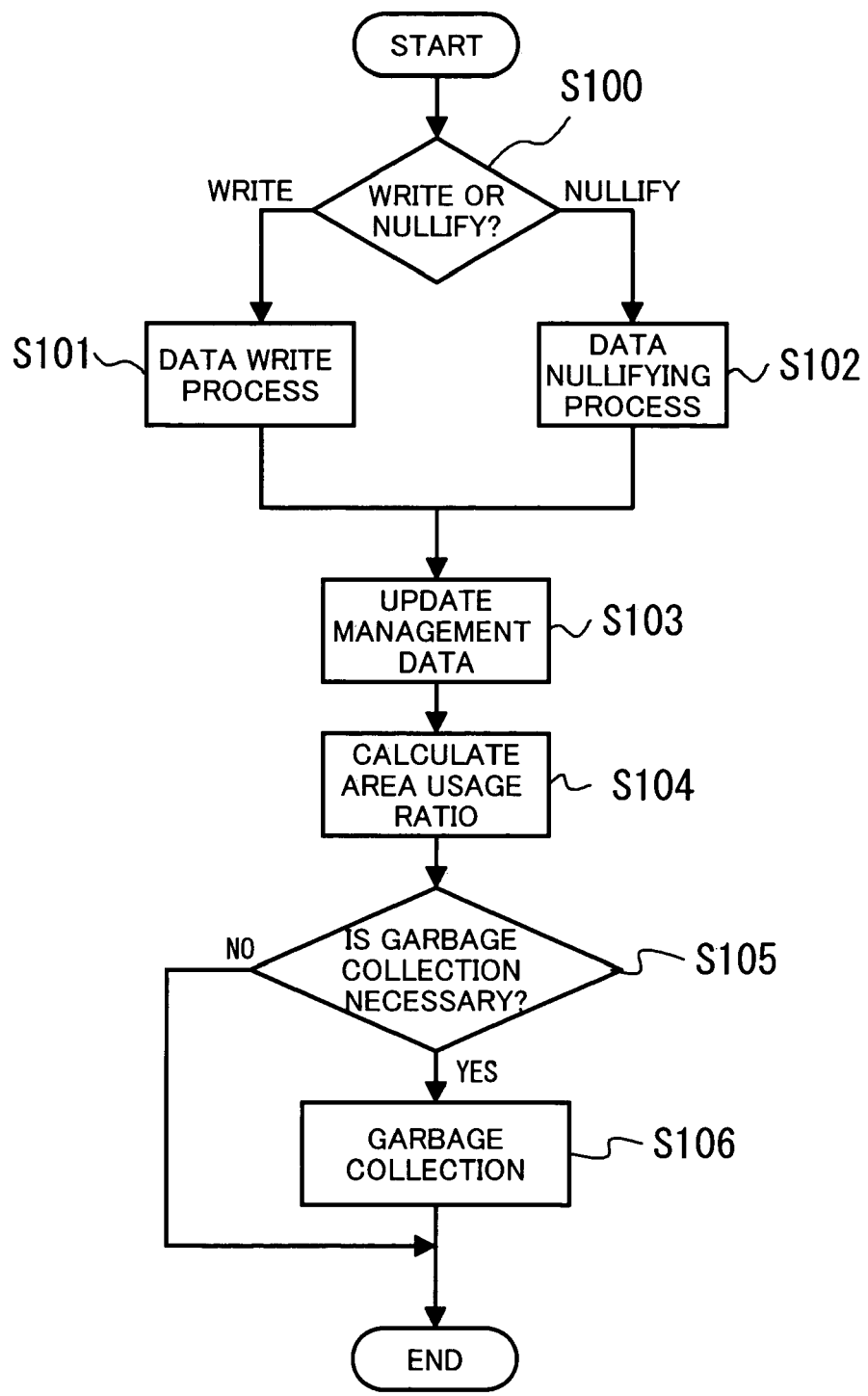
FIG. 18 is a flowchart showing a flow of process to be executed when data is rewritten in the conventional flash memory.

FIG. 17 is a chart illustrating a timing when a ratio is outputted in response to the ratio output instruction. The timing chart illustrates the states of the signals passing on the address bus 70, the control signal line 102 and the data bus 60 appearing when the ratio is outputted.

The control unit 33 of the flash memory 30 receives the ratio output instruction from the data bus 60 when the signal passing on the control signal line 102 rises to the "H" level as shown in FIG. 17. In response to the instruction, the ratio calculator 32 determines the state of the flag area fy and calculates a ratio of the user areas ux with invalid data. The control unit 33 receives the ratio calculated by the ratio calculator 32 and outputs the calculated ratio to the data bus 60 for noticing it to the outside.

As described above, the arrangement of the third embodiment receives the ratio when a ratio output instruction is sent to the flash memory 20. Hence, this arrangement of the third embodiment enables to obtain the ratio on any timing.

The first embodiment has concerned with the arrangement in which the process takes the steps of calculating a ratio of the user areas ux with invalid data at regular intervals, comparing the calculated ratio with the pre-stored predetermined ratio in the flash memory 20, and, if the former is larger than the latter, outputting an interrupt signal for requesting the garbage collection process. On the other hand, the second embodiment concerns with the arrangement in which the calculated ratio is outputted immediately after the data write process or the data nullifying process. However, without being limited to this operation, the ratio calculated at regular intervals may be outputted as it is. As another operation, the second embodiment may execute the process taking the steps of comparing the calculated ratio with the pre-stored predetermined ratio and, if the calculated ratio is larger than the predetermined ratio, outputting the interrupt signal for requiring the garbage collection process.

Further, the third embodiment has been arranged to output a ratio of the user areas ux with invalid data in response to the ratio output instruction sent from the outside. This third arrangement may be arranged like the first embodiment. Concretely, the third embodiment may be arranged so that when an instruction from the outside is inputted into the flash memory, the interrupt signal may be outputted for requiring the garbage collection process.

In the foregoing description, the erased state of the flag area fy has a value of "00," the valid state has a value of "01," and the invalid state has a value of "11." In actual, however, those states are not defined as those values.

As described above, according to the present invention, a flash memory having a memory cell array composed of a plurality of user areas each for storing data and a plurality of flag areas each for indicating the state of the user area is arranged to refer to the value of the flag area, generate the state information that represents the state of the user area for noticing the state to the outside, and outputting the state information to the outside. In the outside of the flash memory, the state inside the flash memory may be easily grasped and it is determined if the garbage collection process is necessary in the current state based on the grasped state of the flash memory.

The foregoing is considered as illustrative only of the principles of the present invention. Further, since numerous modifications and changes will readily occur to those skilled in the art, it is not desired to limit the invention to the exact construction and applications shown and described, and accordingly, all suitable modifications and equivalents may be regarded as falling within the scope of the invention in the appended claims and their equivalents.

What is claimed is:

1. A flash memory having a memory cell array composed of a plurality of user areas each for storing data and a plurality of flag areas each for indicating a state of said each user area, comprising:

a state information generator for generating state information that indicates a state of said each user area by referring to said each flag area, said state information noticing said state to the outside; and an output unit for outputting said state information wherein said state information generator calculates a ratio of invalid states of said user areas by referring to said flag areas and compares the calculated ratio with a pre-stored predetermined ratio, and wherein said state qenerator compares the pre-stored predetermined ratio with said ratio of invalid user areas, and if said ratio is larger than the predetermined ratio, generating said state information that indicates a garbage collection process is necessary.

2. The flash memory according to claim 1, wherein said output unit outputs said ratio of user areas in an invalid state as said state information.

3. The flash memory according to claim 1, wherein said output unit enables to output said state information at regular intervals.

4. The flash memory according to claim 1, wherein said output unit outputs said state information immediately after said data is written on said user areas or said data is nullified.

5. The flash memory according to claim 1, wherein said output unit outputs said state information immediately after receipt of an information request signal for requesting said state information.

6. The flash memory according to claim 1, wherein said predetermined ratio is rewritable.

7. A memory control method for controlling an operation of a flash memory having a memory cell array composed of a plurality of user areas each for storing data and a plurality of flag areas each for indicating a state of said each user area, comprising the steps of:

receiving information that indicates a garbage collection is necessary from said flash memory when a ratio of invalid states of said user areas by referring to said flag area is larger than a pre-stored predetermined ratio wherein the ratio of invalid states of said user areas is calculated by referring to said flag areas, and the pre-stored predetermined ratio is compared with said ratio of invalid user areas; and executing said garbage collection with respect to said flash memory according to said received information.

8. The memory control method according to claim 7, further comprising the step of requesting a notice for said information from said flash memory.

9. A memory control method for controlling an operation of a flash memory having a memory cell array composed of a plurality of user areas each for storing data and a plurality of flag areas each for indicating a state of said each user area, comprising the steps of:

receiving information indicating a ratio of invalid states of said user areas from said flash memory, wherein the ratio of invalid states of said user areas is calculated by referring to said flag areas;

comparing said ratio of user areas in an invalid state with a pre-stored predetermined ratio; and if said ratio of invalid user areas is larger than said pre-stored predetermined ratio, executing a garbage collection with respect to said flash memory.

10. The memory control method according to claim 9, further comprising the step of requesting a notice for said ratio of invalid user areas from said flash memory.

* * * * *